United States Patent
Miyata

(10) Patent No.: US 12,000,567 B2
(45) Date of Patent: Jun. 4, 2024

(54) LIGHT SOURCE DEVICE INCLUDING FIRST SUBSTRATE SUPPORTING FIRST AND SECOND LASER DIODES AND SECOND SUBSTRATE SUPPORTING THIRD LASER DIODE

(71) Applicant: NICHIA CORPORATION, Anan (JP)

(72) Inventor: Tadaaki Miyata, Yokohama (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/996,339

(22) PCT Filed: Mar. 19, 2021

(86) PCT No.: PCT/JP2021/011498
§ 371 (c)(1),
(2) Date: Oct. 15, 2022

(87) PCT Pub. No.: WO2021/210348
PCT Pub. Date: Oct. 21, 2021

(65) Prior Publication Data
US 2023/0204194 A1     Jun. 29, 2023

(30) Foreign Application Priority Data
Apr. 15, 2020 (JP) ................. 2020-073083

(51) Int. Cl.
*F21V 19/00* (2006.01)
*F21Y 113/13* (2016.01)
*F21Y 115/30* (2016.01)

(52) U.S. Cl.
CPC ....... *F21V 19/0015* (2013.01); *F21Y 2113/13* (2016.08); *F21Y 2115/30* (2016.08)

(58) Field of Classification Search
CPC ............ F21V 19/0015; F21Y 2113/13; F21Y 2115/30; H01S 5/0233; H01S 5/40
See application file for complete search history.

(56) References Cited

U.S. PATENT DOCUMENTS

| | | |
|---|---|---|
| 4,901,325 A | 2/1990 | Kato et al. |
| 9,083,136 B1 | 7/2015 | Hasegawa et al. |

(Continued)

FOREIGN PATENT DOCUMENTS

| | | |
|---|---|---|
| JP | S63-237490 A | 10/1988 |
| JP | H01-241504 A | 9/1989 |

(Continued)

OTHER PUBLICATIONS

Ono_JP2013084672_05-2013_machine_translation.pdf (Year: 2013).*
International Search Report in PCT/JP2021/011498, dated May 25, 2021.

*Primary Examiner* — Tracie Y Green
(74) *Attorney, Agent, or Firm* — Global IP Counselors, LLP

(57) ABSTRACT

A light source device 100 includes a first substrate 10 having a first mounting surface 10a, a second substrate 11 having a second mounting surface 11a that opposes the first mounting surface, a first laser diode 30a directly or indirectly supported by the first mounting surface, a second laser diode 30b directly or indirectly supported by the first mounting surface, and a third laser diode 30c directly or indirectly supported by the second mounting surface. The emission point of the third laser diode is positioned between the emission point of the first laser diode and the emission point of the second laser diode in the width direction, and in a plan view, when viewed in the direction perpendicular to the first mounting surface, at least one the first laser diode and the second laser diode at least partially overlaps the third laser diode.

20 Claims, 6 Drawing Sheets

(56) References Cited

U.S. PATENT DOCUMENTS

| | | |
|---|---|---|
| 11,363,243 B2 * | 6/2022 | Dodworth ............ H04N 9/3155 |
| 2001/0050531 A1 | 12/2001 | Ikeda |
| 2008/0310471 A1 | 12/2008 | Bessho et al. |
| 2009/0040477 A1 | 2/2009 | Matsumoto |
| 2010/0309661 A1 * | 12/2010 | Okura ................. H01S 5/02326 |
| | | 362/231 |
| 2011/0211610 A1 | 9/2011 | Saito et al. |

FOREIGN PATENT DOCUMENTS

| | | |
|---|---|---|
| JP | H11-4047 A | 1/1999 |
| JP | 2001-230502 A | 8/2001 |
| JP | 2005-327826 A | 11/2005 |
| JP | 2005-327905 A | 11/2005 |
| JP | 2005-35361 A | 12/2005 |
| JP | 2005-353614 A | 12/2005 |
| JP | 2009-027149 A | 2/2009 |
| JP | 2009-044066 A | 2/2009 |
| JP | 2011-181690 A | 9/2011 |
| JP | 2013-084672 A | 5/2013 |
| JP | 2013084672 A * | 5/2013 |
| JP | 2015-153842 A | 8/2015 |
| WO | 2019003546 A1 | 1/2019 |

* cited by examiner

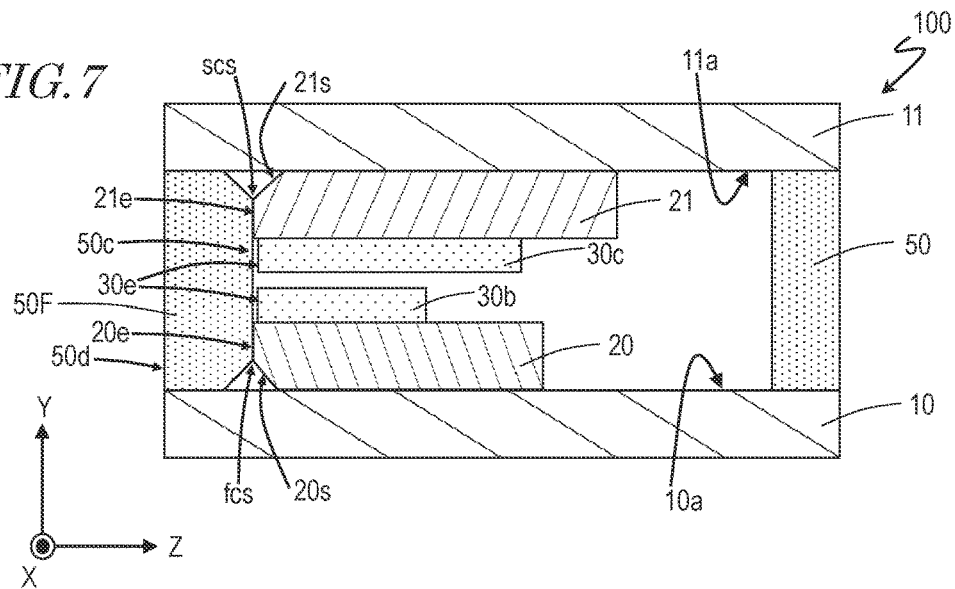
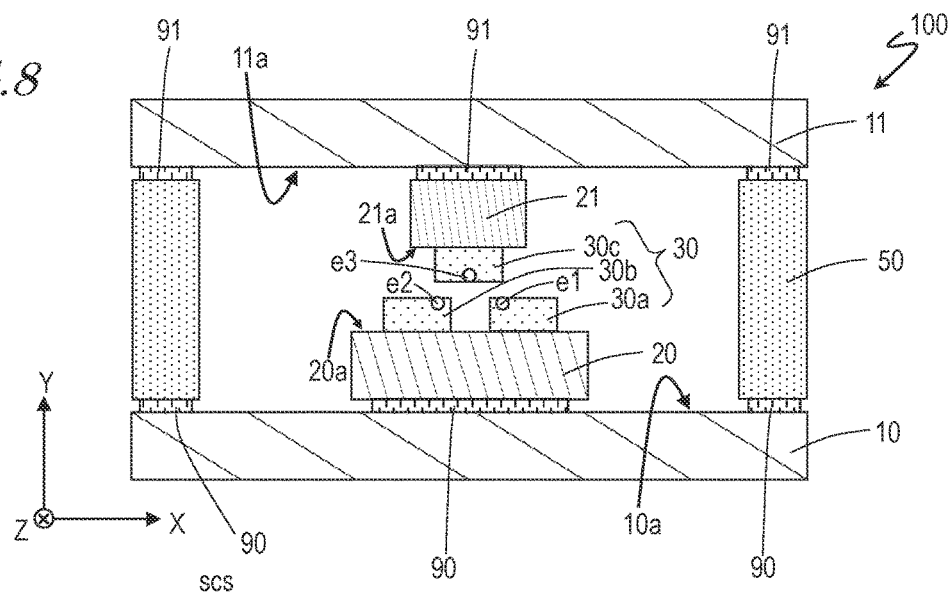
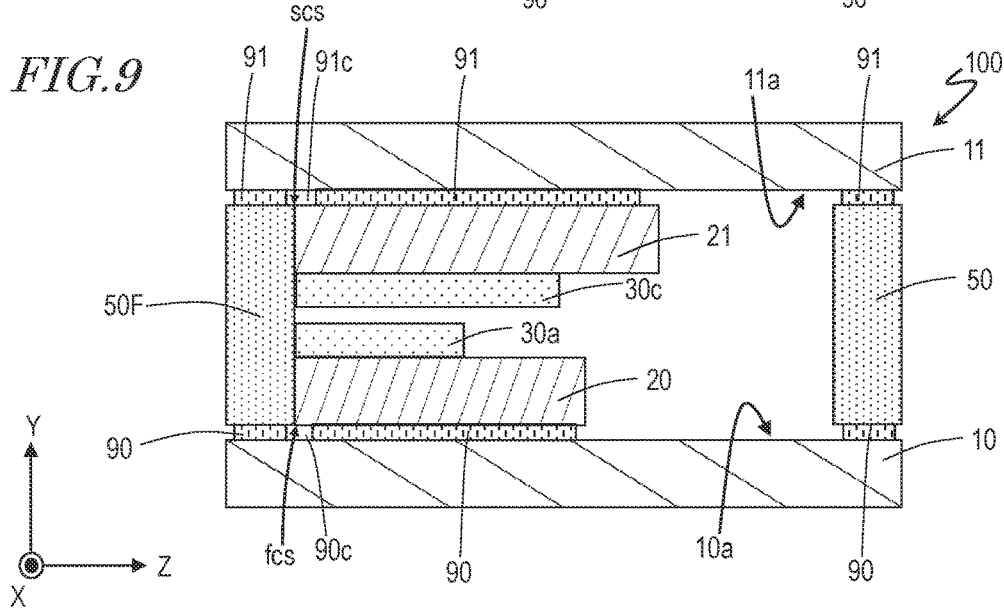

LIGHT SOURCE DEVICE INCLUDING FIRST SUBSTRATE SUPPORTING FIRST AND SECOND LASER DIODES AND SECOND SUBSTRATE SUPPORTING THIRD LASER DIODE

TECHNICAL FIELD

The present disclosure relates to a light source device.

BACKGROUND ARTS

Light source devices including a plurality of laser diodes have been studied for various application areas. Patent Literature 1 discloses a structure in which a plurality of light emitting elements are arranged between a pair of substrates such that the emission points of the light emitting elements are positioned at the same height.

CITATION LIST

Patent Literature

Patent Literature 1: Japanese Patent Application Publication No. 2009-27149

SUMMARY OF INVENTION

Technical Problem

The present disclosure provides a light source device with improved light collection efficiency.

Solution to Problem

A light source device according to a non-limiting exemplary embodiment of the present disclosure includes a first substrate having a first mounting surface, a second substrate having a second mounting surface that opposes the first mounting surface, a first laser diode directly or indirectly supported by the first mounting surface, a second laser diode directly or indirectly supported by the first mounting surface, and a third laser diode directly or indirectly supported by the second mounting surface, wherein the emission point of the third laser diode is positioned between the emission point of the first laser diode and the emission point of the second laser diode in the width direction, and in a plan view, when viewed in the direction perpendicular to the first mounting surface, at least one of the first laser diode and the second laser diode at least partially overlaps the third laser diode.

Advantageous Effects of Invention

According to an embodiment of the present disclosure, a light source device with improved light collection efficiency can be provided.

BRIEF DESCRIPTION OF THE DRAWINGS

FIG. 7 is a cross-sectional view in the YZ plane of another structure of the exemplary light source device according to the First Embodiment.

FIG. 8 is a cross-sectional view in the XY plane of yet another structure of the exemplary light source device according to the First Embodiment.

FIG. 9 is a cross-sectional view in the YZ plane of the structure of the exemplary light source device according to the First Embodiment.

DESCRIPTION OF EMBODIMENTS

Figure 1:
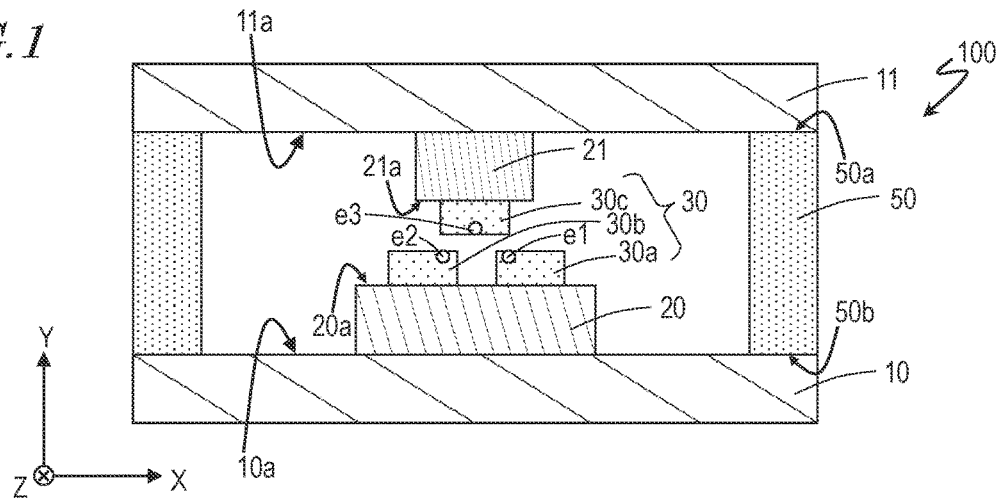
FIG. 1 is a cross-sectional view in the XY plane of an exemplary light source device according to a First Embodiment.

Certain embodiments of the present disclosure will be explained in detail below with reference to the accompanying drawings. The embodiments described below are exemplary, and the light source devices according to the present disclosure are not limited to those described below. For example, the numerical values, shapes, materials, manufacturing steps, and the sequence of the steps described in the embodiments below are merely examples, and are modifiable in various ways to the extent that such a modification does not cause technical inconsistencies. The various forms described below are merely exemplary, and various combinations can be made to the extent that such a combination does not cause technical inconsistencies.

The dimensions, shapes and the like of the constituent elements shown in the drawings might be exaggerated for clarity of explanation, and might not reflect the dimensions and shapes of, and the relative sizes among the constituent elements in an actual light source device. Certain elements might be omitted in a drawing so as not to make the drawing excessively complex.

In the description below, the constituent elements having practically the same functions are denoted by common reference numerals for which explanation might be omitted. Terms indicating specific directions or positions (e.g., "upper," "lower," "right," "left" and other terms including or related to these) might be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings, or actual products and manufacturing devices outside of the present disclosure, does not have to be the same as those shown in the referenced drawing.

First Embodiment

Figure 2:
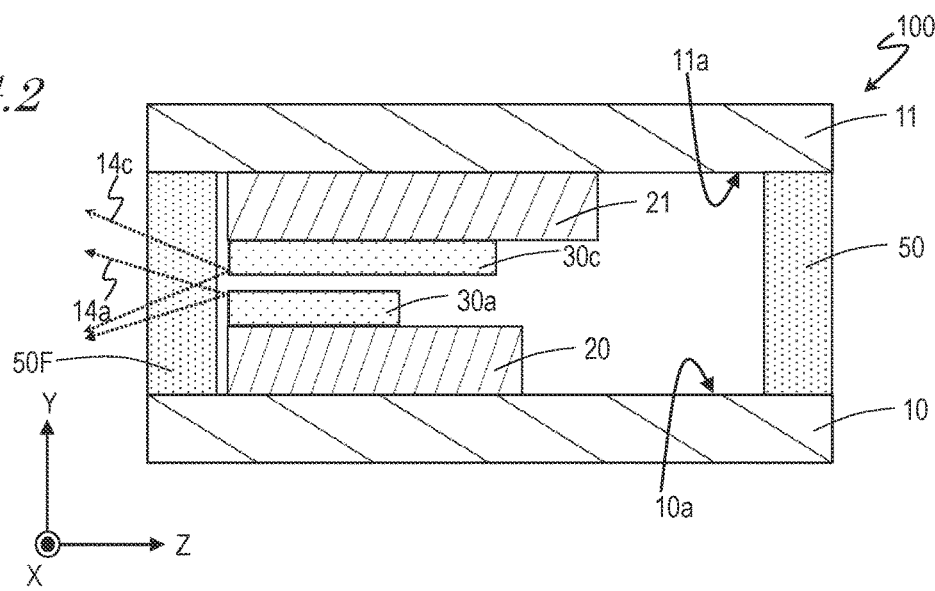
FIG. 2 is a cross-sectional view in the YZ plane of the exemplary light source device according to the First Embodiment.

A light source device 100 according to a First Embodiment will be explained with reference to FIG. 1 to FIG. 4B. FIG. 1 is a cross-sectional view in the XY plane of the light source device 100 according to this embodiment. In FIG. 1, three emission points e1, e2, and e3 located in the emission end surfaces of three laser diodes 30a, 30b, and 30c are schematically indicated using circles. In the accompanying drawings, the X, Y, and Z axes that are orthogonal to one another are provided for reference purposes. FIG. 2 is a cross-sectional view in the YZ plane of the light source device 100 according to this embodiment.

Figure 3:
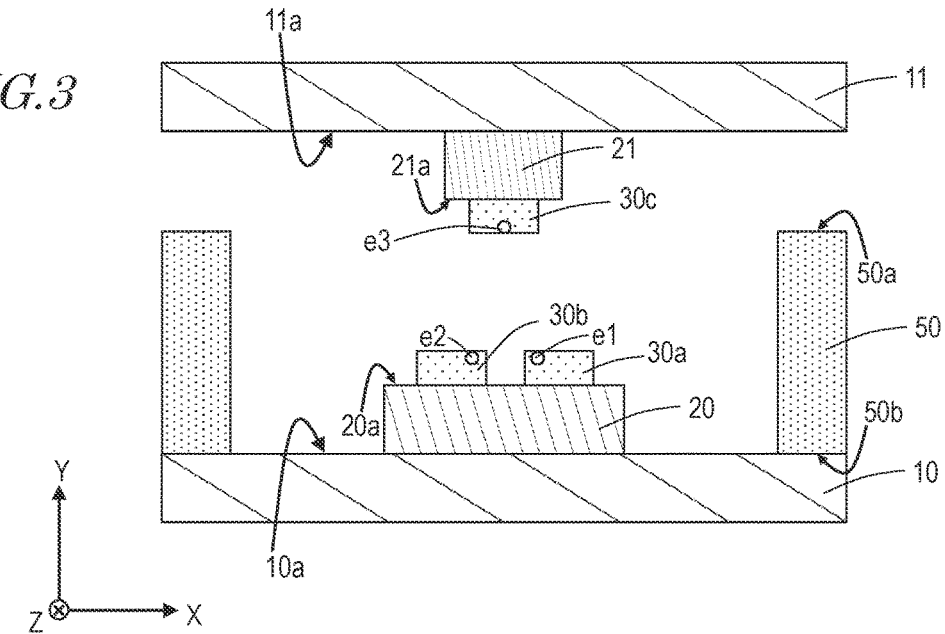
FIG. 3 is a schematic diagram of the light source device when the pair of substrates are separated.
Figure 4A:
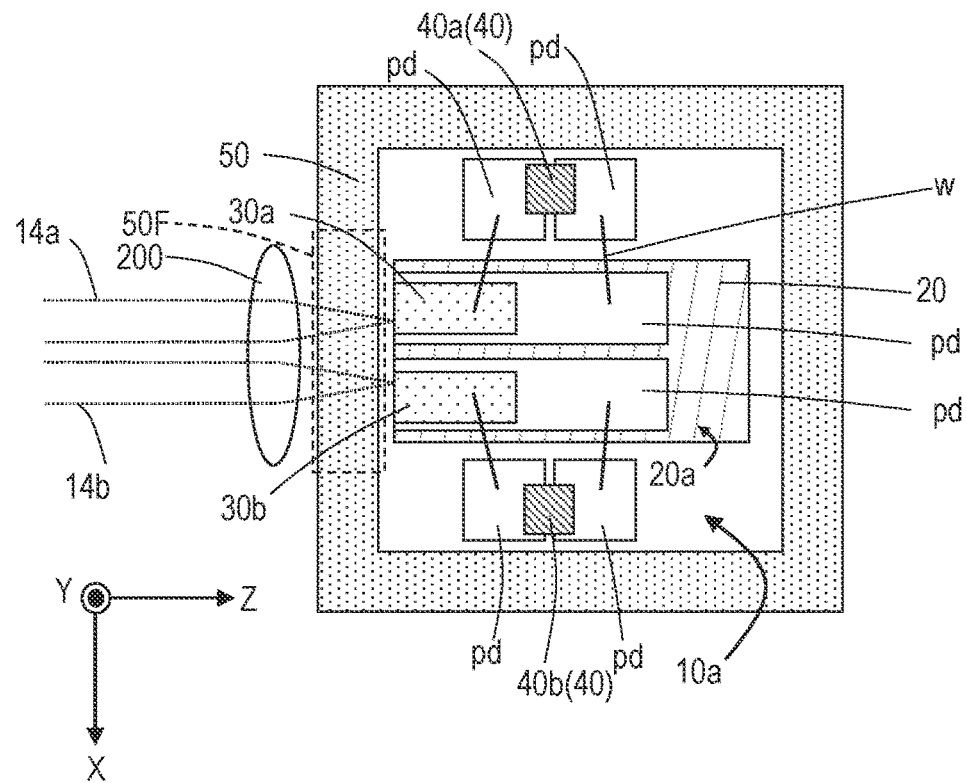
FIG. 4A is a plan view of one of the pair of substrates when viewed in the direction perpendicular to the mounting surface of the substrate.
Figure 4B:
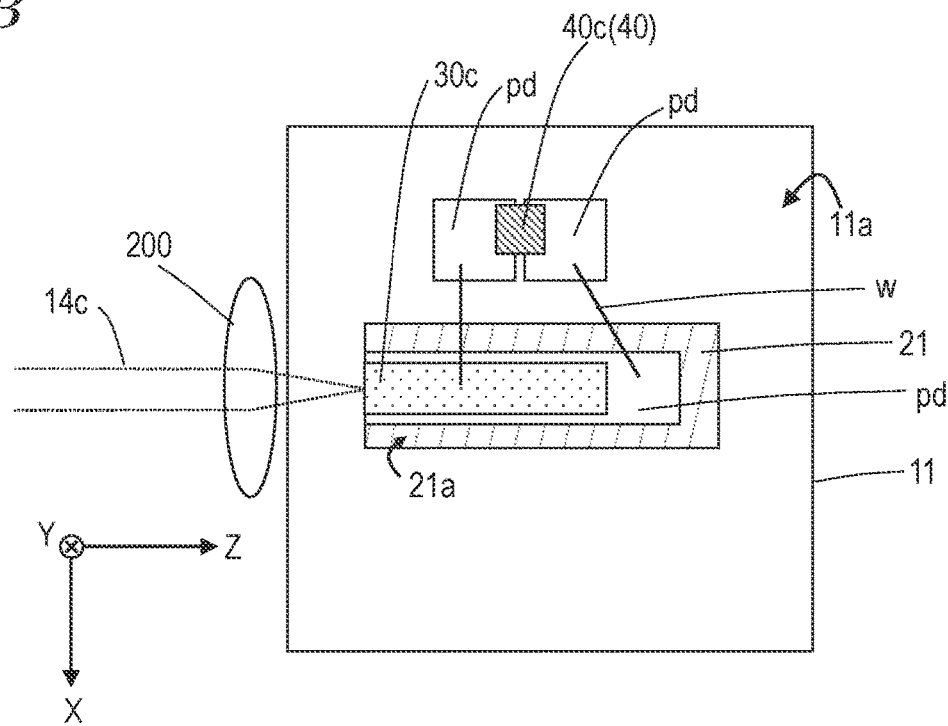
FIG. 4B is a plan view of the other of the pair of substrates when viewed in the direction perpendicular to the mounting surface of the substrate.

FIG. 3 is a schematic diagram of the light source device 100 when the pair of substrates 10 and 11 are separated. FIG. 4A is a plan view of the substrate 10 (the lower portion in FIG. 3) when viewed in the direction perpendicular to the mounting surface 10a of the substrate 10. FIG. 4B is a plan view of the substrate 11 (the upper portion in FIG. 3) when viewed in the direction perpendicular to the mounting surface 11a of the substrate 11. FIG. 4A shows the two laser diodes 30a and 30b mounted on the mounting surface 10a when viewed along the Y axis in the negative direction, and FIG. 4B shows the laser diode 30c mounted on the mounting surface 11a when viewed along the Y axis in the positive direction.

The light source device 100 includes a first substrate 10, a second substrate 11, a first submount 20, a second submount 21, a plurality of laser diodes 30, and a frame 50. The laser diodes 30 in this embodiment include a first laser diode 30a, a second laser diode 30b, and a third laser diode 30c. Hereinafter, the first laser diode, the second laser diode, and the third laser diode will be simply referred to as "laser diodes." As described later, the light source device 100 can include a plurality of protective devices 40, but the protective devices are not shown in FIG. 1 or FIG. 2 so as not to make the drawings excessively complex. The light source device 100 can further include a temperature sensor (not shown) such as a thermistor for measuring the internal temperature.

An example of the shape of the light source device 100 in this embodiment is roughly a rectangular cuboid as shown in FIG. 4A. For example, the size of the light source device 100 can be about 1.0 mm to about 10.0 mm in the X direction and about 2.0 mm to about 5.0 mm in the Z direction.

The thickness in the Y direction can be about 1.0 mm to about 3.0 mm. The light source device 100 can be suitably utilized as a light source of, for example, a head-mounted display, projector, lighting fixture or the like.

The first substrate 10 and the second substrate 11 make up a pair of substrates. The first substrate 10 has a first mounting surface 10a that directly or indirectly supports a laser diode 30, and the second substrate 11 has a second mounting surface 11a that directly or indirectly supports a laser diode 30. Hereinafter, the first substrate and the second substrate will be simply referred to as "substrates," and the first mounting surface and the second mounting surface will be simply referred to as "mounting surfaces." The substrates are sheet-shaped members. The pair of substrates 10 and 11 are disposed such that the mounting surface 10a and the mounting surface 11a oppose one another. The pair of substrates 10 and 11 can be formed by using a ceramic as a main material. Without being limited to ceramics, the substrates may be formed from a metal. For example, a ceramic, such as aluminum nitride, silicon nitride, aluminum oxide, or silicon carbide, a metal, such as copper, aluminum, or iron, a complex, such as copper-molybdenum, a copper-diamond composite material, or copper tungsten, or another material, such as silicon or a resin can be used as a main material for the substrates.

In this embodiment, the pair of substrates 10 and 11 each has a conductor wiring layer (not shown) electrically connected to the laser diodes 30 and the protective devices 40. As shown in FIG. 4A or FIG. 4B, a pair of electrode pads pd for mounting a protective device 40 is provided as a part of the conductor wiring layer on the mounting surface of each substrate. A conductor wiring layer can be formed from a metal material, such as tungsten, molybdenum, nickel, gold, silver, platinum, titanium, copper, aluminum, ruthenium, or the like. A conductor wiring layer can have a multilayer structure in which the layers are electrically connected using vias.

The first submount 20 and the second submount 21 are heat dissipating members, and typically have a rectangular cuboid shape, without being limited thereto. Each submount functions to dissipate away the heat generated by a laser diode 30. From the perspective of improving the heat dissipation properties, each submount is preferably formed from a material having a higher heat conductivity coefficient than that of the laser diodes 30. For such a material, for example, a ceramic material, such as AlN, SiC, or SiN, a metal material which includes at least one selected from the group consisting of Cu, Al, Ag, Fe, Ni, Mo, Cu, W, and CuMo is used. Hereinafter, the first submount and the second submount will simply be referred to as "submounts."

The submount 20 is bonded to the mounting surface 10a of the substrate 10, and the submount 21 is bonded to the mounting surface 11a of the substrate 11. Such bonding can be achieved via a layer of an inorganic material such as a metal or an organic material. However, in the case of using a blue or green light emitting laser diode, an organic material is preferably avoided considering the dust collecting effect of the laser beam. The thickness of the submount 20 may be the same as or different from the thickness of the submount 21. The height of the emission point of a laser diode from the mounting surface can be adjusted by adjusting the thickness of the submount. An emission point in the present disclosure generally refers to the emitter region of a laser diode. Emission points will be described in detail later.

The submount 20 has a mounting surface 20a on which the laser diode 30a and the laser diode 30b are disposed. The laser diodes 30a and 30b are mounted on the mounting surface 10a of the substrate 10 in the state of being fixed to the submount 20. Bonding the laser diode 30a and the laser diode 30b to a common submount 20 can reduce the number of submounts used, providing the benefit of reducing the number of parts. The submount 21 has a mounting surface 21a on which the laser diode 30c is disposed. The laser diode 30c is mounted on the mounting surface 11a of the substrate 11 in the state of being fixed to the submount 21.

For the laser diodes 30, for example, a blue light emitting laser diode, a green light emitting laser diode, a red light emitting laser diode, or the like can be employed. A laser diode that emits light in other wavelength region, such as near infrared light or ultraviolet light, may be employed.

In the present disclosure, blue light refers to the light having a peak emission wavelength in a range of 420 nm to 494 nm. Green light refers to the light having a peak emission wavelength in a range of 495 nm to 570 nm. Red light refers to the light having a peak emission wavelength in a range of 605 nm to 750 nm.

Examples of blue or green light emitting laser diodes include those that include a nitride semiconductor. For the nitride semiconductors, for example, GaN, InGaN, and AlGaN can be used. Examples of red light emitting laser diodes include those that include an InAlGaP-based, GaInP-based, GaAs-based, and AlGaAs-based semiconductor.

The laser beam emitted from a laser diode spreads, and forms an elliptical far field pattern (hereinafter referred to as "FFP") in a plane parallel with the emission end surface. An FFP is defined by the light intensity distribution of a laser beam at a location spaced apart from the emission end surface. In the light intensity distribution, the portion having an intensity of at least $1/e^2$ relative to the peak intensity value may be referred to as beam's cross section.

In this embodiment, the laser diodes 30 are of edge-emitting type each having an end surface through which the laser beam exits, but may be of vertical-cavity surface-emitting laser (VCSEL) type. The peak emission wavelengths of the outgoing laser beams from the laser diode 30a, the laser diode 30b, and the laser diode 30c are different from one another. The laser diode 30a emits blue light, the laser diode 30b emits green light, and the laser diode 30c emits red light. According to this embodiment, a light source device in which laser diodes 30 of three primary colors RGB are mounted in a package, for example, can be achieved. In the present disclosure, the laser diodes 30 preferably include at least two types of laser diodes having different peak emission wavelengths.

A plurality of collimating lenses are occasionally used to separately collimate a plurality of laser beams from a plurality of laser diodes. Using a single collimating lens to collimate multiple laser beams is effective in reducing the size of a light source device. However, in the case in which a plurality of laser diodes are lined up on a substrate and laser beams exit the respective emission points, it is impossible to have all of the laser beams to become incident on a collimating lens at the same position. According to a light source device of the present disclosure, bringing the emission points close together by ingeniously arranging the laser diodes allows a single collimating lens to form substantially collimated beams with improved light collection efficiency.

As shown in FIG. 4A and FIG. 4B, the light source device 100 in this embodiment includes a single collimating lens 200 disposed outward from the frame 50. The laser beam 14a from the laser diode 30a, the laser beam 14b from the laser diode 30b, and the laser beam 14c from the laser diode 30c are collimated by the collimating lens 200. In FIG. 4A, for ease of understanding, the collimated laser beams 14a and 14b are shown spaced apart. In practice, however, the emission points e1 and e2 can be arranged closely enough for the laser beams 14a and 14b to overlap. The collimating lens 200 is not limited to that illustrated in the drawing, and can be disposed in the space inward of the frame 50.

Figure 5:
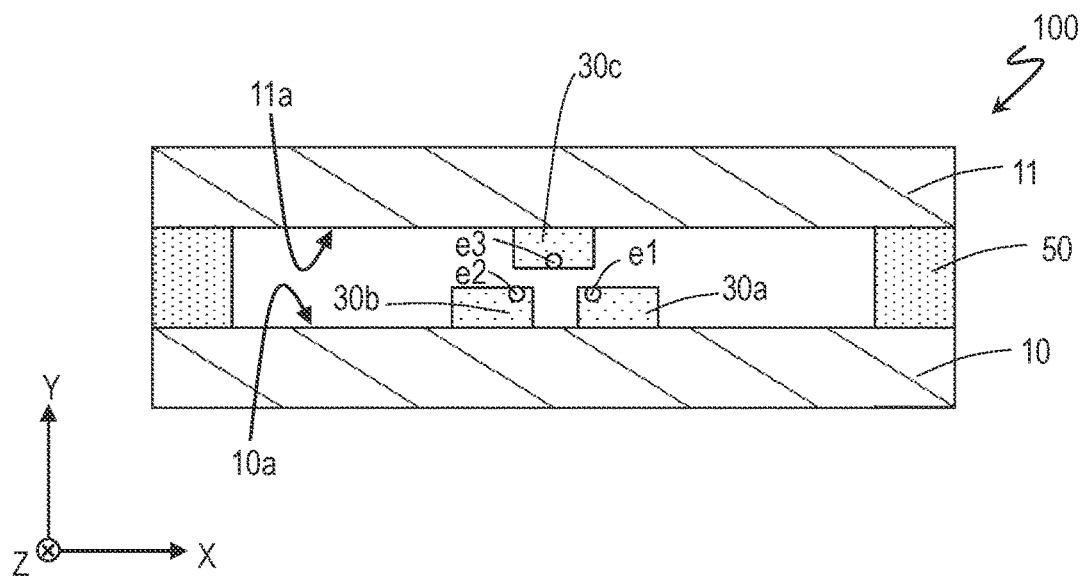
FIG. 5 is a cross-sectional view in the XY plane of a variation of the exemplary light source device according to the First Embodiment.

FIG. 5 is a cross-sectional view in the XY plane of a variation of the light source device 100 according to this embodiment. Each laser diode 30 can be bonded to the mounting surface of a substrate without interposing a submount. Accordingly, in the present disclosure, a submount is not an essential member. In the example shown in FIG. 5, the two laser diodes 30a and 30b are bonded to the mounting surface 10a, and the laser diode 30c is mounted on the mounting surface 11a. Without being limited to this example, for example, the two laser diodes 30a and 30b may be mounted on the mounting surface 10a via a submount 20, while mounting the laser diode 30c on the mounting surface 11a. Conversely, the two laser diodes 30a and 30b may be bonded to the mounting surface 10a while mounting the laser diode 30c on the mounting surface 11a via a submount 21. In consideration of improving heat dissipation performance and adjusting the positions of the emission points in the height direction, the laser diodes 30 are preferably mounted on a submount. Height adjustments of the emission points will be discussed in detail later.

An electrode pad electrically bonded to a laser diode 30 is formed on the mounting surface of a submount. In this embodiment, as shown in FIG. 4A, two electrode pads pd electrically bonded to the laser diode 30a and the laser diode 30b are formed on the mounting surface 20a of the submount 20. As shown in FIG. 4B, an electrode pad pd electrically bonded to the laser diode 30c is formed on the mounting surface 21a of the submount 21.

Figure 6:
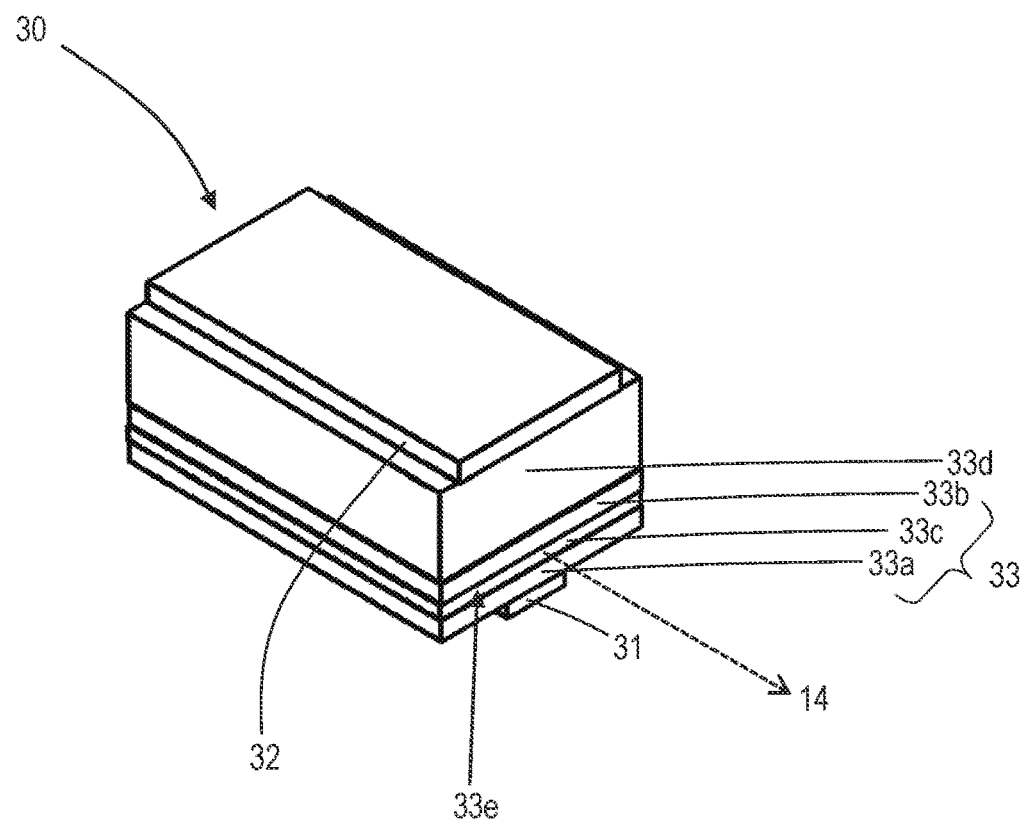
FIG. 6 is a schematic diagram of a typical structure of a laser diode 30.

FIG. 6 is a schematic diagram illustrating a typical structure of a laser diode 30. FIG. 6 shows the optical axis of the laser beam 14. The laser diode 30 has a p-side electrode 31, an n-side electrode 32, a semiconductor stack structure 33 which includes a p-side semiconductor layer 33a, an n-side semiconductor layer 33b, and an active layer 33c positioned between the p-side semiconductor layer 33a and the n-side semiconductor layer 33b, and a substrate 33d that supports the semiconductor stack structure 33. One of the end surfaces of the active layer 33c is the emission end surface (or the emitter region) 33e through which the laser beam 14 exits. The laser diode 30 emits the laser beam 14 from the emitter region 33e when a voltage is applied across the p-side electrode 31 and the n-side electrode 32 allowing an electric current to flow across the diode. In this embodiment, the size of the laser diode 30 in a plan view is, for example, about 50 μm to about 500 μm widthwise and about 100 μm to about 2000 μm lengthwise. The thickness can be about 50 μm to about 200 μm.

The laser diode 30 is directly or indirectly mounted on the mounting surface of a substrate in a face-down manner or a face-up manner. The term "face-down manner" means mounting the laser diode 30 on the mounting surface such that the active layer 33c is closer to the submount as compared to the substrate 33d. The term "face-up manner" means mounting the laser diode 30 on the mounting surface such that the active layer 33c is more distant from the submount as compared to the substrate 33d.

In this embodiment, the n-side electrode of each laser diode 30 is electrically connected to an electrode pad formed on the mounting surface of a submount. As shown in FIG. 1, the laser diodes 30a and 30b are indirectly face-up mounted on the mounting surface 10a of the substrate 10, more specifically, face-up mounted on the mounting surface 20a of the submount 20. The laser diode 30c is indirectly face-up mounted on the mounting surface 11a of the substrate 11, more specifically face-up mounted on the mounting surface 21a of the submount 21. The laser diode 30c is positioned to oppose the laser diodes 30a and 30b. Supporting the three laser diodes 30a, 30b, and 30c face up on the mounting surfaces can reduce the distance between the two emission points e1 and e3 or the two emission points e2 and e3 in the direction perpendicular to the mounting surface 10a, i.e., in the height direction.

An example of a protective device 40 is a Zener diode. A protective device 40 is electrically connected to a laser diode 30 in parallel, and functions as a protective circuit to ensure that the reverse voltage applicable to the laser diode 30 does not exceed a prescribed level. In the example shown in FIG. 4A and FIG. 4B, a protective device 40a is disposed as a protective circuit for the laser diode 30a, a protective device 40b is disposed as a protective circuit for the laser diode 30b, and a protective device 40c is disposed as a protective circuit for the laser diode 30c.

As shown in FIG. 4A, the protective devices 40a and 40b are each mounted on a pair of electrode pads pd formed on the mounting surface 10a of the substrate 10. The cathode of a pair of electrode pads pd on the mounting surface 10a is electrically connected via a conductive wire w to the electrode pad pd on the mounting surface 20a that is bonded to the n-side electrode of the laser diode 30a, and the anode of the pair of electrode pads pd is electrically connected via a conductive wire w to the p-side electrode of the laser diode 30a. In this manner, the protective device 40a is electrically connected to the laser diode 30a in parallel. The protective device 40b is electrically connected to the laser diode 30b in parallel in a similar manner as the protective device 40a.

As shown in FIG. 4B, the protective device 40c is mounted on the pair of electrode pads pd formed on the mounting surface 11a of the substrate 11. The cathode of the pair of electrode pads pd is electrically connected via a conductive wire w to the electrode pad pd on the mounting surface 21a that is bonded to the n-side electrode of the laser diode 30c, and the anode of the pair of electrode pads pd is electrically connected via a conductive wire w to the p-side electrode of the laser diode 30c. In this manner, the protective device 40c is electrically connected to the laser diode 30c in parallel.

The frame 50 is fixed to the substrate in the peripheral area of the mounting surface 10a so as to surround the laser diodes 30. In the example shown in FIG. 1, the lower end surface 50b of the frame 50 is bonded to the mounting surface 10a of the substrate 10. Such bonding can be achieved via a layer of an inorganic material such as a metal or an organic material. However, when using a blue or green light emitting laser diode, an organic material is preferably avoided considering the dust collecting effect of the laser beam.

The substrate 11 is fixed to the upper end surface 50a of the frame 50. The frame 50 defines the space that houses the laser diodes 30. The upper end surface 50a of the frame 50 is bonded to the mounting surface 11a of the substrate 11 in a similar manner as the substrate 10. The substrate 11 functions as a cap to hermetically seal the laser diodes 30 in the space. Hermetic sealing allows for reducing the dust attracting effect by a laser beam. However, a hermetic seal is not essential.

As shown in FIG. 2, the frame 50 has a light transmitting part 50F through which the laser beams 14 from the laser diodes 30 pass. The light transmitting part 50F is positioned to cross the laser beams 14a and 14c above the substrate 10. The light transmitting part 50F can be formed from a material that transmits light, for example, glass or a transparent ceramic material. The glass may contain sapphire or the like. The portion of the frame 50 excluding the light transmitting part 50F can be formed, for example, from silicon, glass, ceramic, or the same material as that for the substrates described above.

Referring back to FIG. 1, the arrangement of the three emission points e1, e2, and e3 in this embodiment will be explained in detail.

The emission point e3 of the laser diode 30c which is bonded to the submount 21 is positioned between the emission point e1 of the laser diode 30a and the emission point e2 of the laser diode 30b which are bonded to the submount 20 in the width direction of the laser diodes 30 paralleling the X direction.

In a plan view, when viewed in the direction perpendicular to the mounting surface 10a of the substrate 10, at least one of the laser diodes 30a and 30b at least partially overlaps the laser diode 30c. In the example shown in FIG. 1, both of the laser diodes 30a and 30b at least partially overlap the laser diode 30c. According to such an arrangement of the laser diodes 30, the interval between the two laser diodes 30a and 30b can be set as equal to or smaller than the width of the laser diode 30c. This allows the emission points of the laser diodes 30 to be positioned close together, thereby facilitating light collection. As a result, the size of the collimating lens 200 can be reduced. Without being limited to the example shown in FIG. 1, the laser diode 30a may entirely overlap the laser diode 30c, or the laser diode 30b may entirely overlap the laser diode 30c in a plan view.

The width direction distance from the emission point e1 of the laser diode 30a to the laser diode 30b is smaller than the width direction distance from the center of the laser diode 30a to the laser diode 30b. In other words, the emission point e1 of the blue light emitting laser diode 30a may be located closer to the side that faces the laser diode 30b using the center of the laser diode 30a as a reference. Alternatively, the width direction distance from the emission point e2 of the laser diode 30b to the laser diode 30a is smaller than the width direction distance from the center of the laser diode 30b to the laser diode 30a. In other words, the emission point e2 of the green light emitting laser diode 30b may be located closer to the side that faces the laser diode 30a using the center of the laser diode 30b as a reference. Here, the center of a laser diode refers to the line segment or a point on the line segment that substantially bisects in the width direction the end surface of the laser diode on which the emission point is located.

In this embodiment, as shown in FIG. 1, the emission point e1 is located closer to the side which faces the laser diode 30b, and the emission point e2 is located closer to the side that faces the laser diode 30a. Such an emission point arrangement can reduce the interval between the two emission points e1 and e2, thereby allowing the two emission points e1 and e2 to be close to one another. Furthermore, the width of the gap between the laser diode 30a and the laser diode 30b is equal to or smaller than the width of the laser diode 30c. When the three laser diodes 30a, 30c, and 30b are aligned on the same mounting surface in this order, the distance between the emission points e1 and e2 would be larger than the width of the laser diode 30c. According to this embodiment, the distance between the emission points e1 and e2 can be made smaller than the width of the laser diode 30c.

The optical axis of the outgoing laser beam 14a from the laser diode 30a, the optical axis of the outgoing laser beam 14b from the laser diode 30b, and the optical axis of the outgoing laser beam 14c of the laser diode 30c can be positioned in a circle whose diameter is the smallest width among the widths of the three laser diodes 30a, 30b, and 30c. For example, the emission points e1, e2, and e3 of the three laser diodes 30a, 30b, and 30c can be as close to one another as 0.15 mm or less.

FIG. 7 is a cross-sectional view in the YZ plane of another structure of the light source device 100 according to this embodiment. The light transmitting part 50F of the frame 50 has an incident surface 50c on which the laser beams from the laser diodes 30 become incident and an emission surface 50d through which the laser beams from the laser diodes 30 exit.

One end surface of each of the submount 20 and the submount 21 may be partly in contact with the incident surface 50c. In more detail, the submount 20 has an end surface 20e which includes an oblique surface 20s on the side where the incident surface 50c of the light transmitting part 50F is located. The submount 21 has an end surface 21e which includes an oblique surface 21s on the side where the incident surface 50c of the light transmitting part 50F is located. The portion of the end surface 20e excluding the oblique surface 20s is in contact with the incident surface 50c, and the portion of the end surface 21e excluding the oblique surface 21s is in contact with the incident surface 50c.

Because the refractive index of a lens changes depending on the wavelength of the outgoing light from a laser diode 30a, the focal distance of the lens differs depending on the wavelength of the light. This can cause chromatic aberration, making it necessary to adjust the positions of the emission points of the laser diodes 30 in the Z direction paralleling the optical axes of the laser beams of the laser diodes 30. According to this embodiment, abutting the end surfaces of the submounts against the incident surface of the light transmitting part can provide the benefit of facilitating the positional adjustments of the emission points of the laser diodes 30 in the Z direction.

The portion of the end surface 20e of the submount 20 in contact with the incident surface 50c forms a first contact surface fcs. The first contact surface fcs is spaced apart from the mounting surface 10a. The portion of the end surface 21e of the submount 21 in contact with the incident surface 50c forms a second contact surface scs. The second contact surface scs is spaced apart from the mounting surface 11a. For the bonding material that bonds the substrates and the submounts, for example, a metal such as AuSn is used. Spacing the first contact surface fcs and the second contact surface scs apart from the mounting surfaces 10a and 11a, respectively, can secure spaces for allowing excess bonding material to escape. Allowing the bonding material to escape to the spaces can prevent the bonding material from adhering to the first contact surface fcs and the second contact surface scs. This, as a result, allows for precise positional adjustments of the emission points of the laser diodes 30 in the Z direction.

FIG. 8 is a cross-sectional view in the XY plane of another structure of the light source device 100. FIG. 9 is a cross-sectional view in the YZ plane of the light source device 100. In this example, a first wiring layer 90 is disposed between the submount 20 and the substrate 10 as well as between the frame 50 and the substrate 10, and the groove 90c formed in the first wiring layer 90 spaces the first contact surface fcs apart from mounting surface 10a. Similarly, a second wiring layer 91 is disposed between the submount 21 and the substrate 11 as well as between the frame 50 and the substrate 11, and the groove 91c formed in the second wiring layer 91 spaces the second contact surface scs apart from the mounting surface 11a. The wiring layers can be formed from a metal material, such as tungsten, molybdenum, nickel, gold, silver, platinum, titanium, copper, aluminum, ruthenium, or the like. With such a structure, spaces can be secured for allowing excess bonding material to escape when the frame 50 and the submounts 20 and 21 are bonded to the substrates 10 and 11 via the wiring layers. This facilitates positional adjustments of the emission points of the laser diodes 30 in the Z direction.

Figure 10:
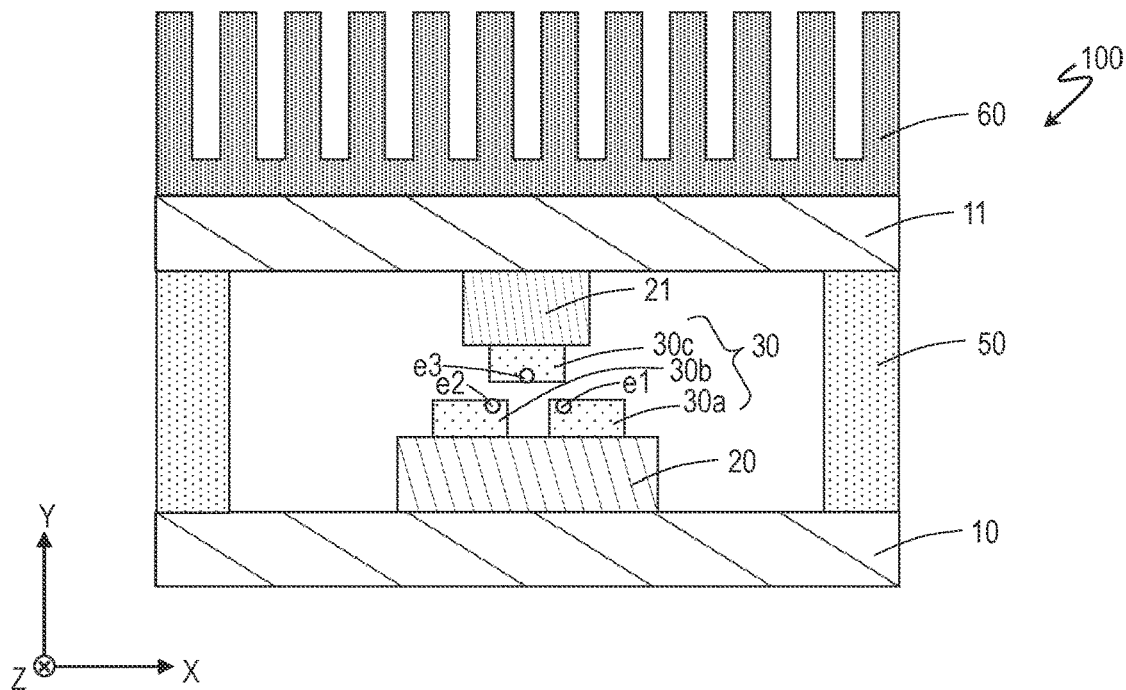
FIG. 10 is a cross-sectional view in the XY plane of another structure of the exemplary light source device according to the First Embodiment.

FIG. 10 is a cross-sectional view in the XY plane of another structure of the light source device 100 according to this embodiment. As shown in the drawing, the light source device 100 can further include a heat dissipating device 60. The heat dissipating device 60 is disposed on the substrate 11 that supports the red light emitting laser diode 30c. The temperature characteristics of the red light emitting laser diode 30c are readily affected by heat as compared to the temperature characteristics of the blue light emitting laser diode 30a or the green light emitting laser diode 30b. Accordingly, the optical output or the wavelength of the light from the laser diode 30c might be affected and changed by the heat generated by the laser diode 30a and/or the laser diode 30b. Providing a heat dissipating device 60 on the substrate 11 can externally dissipate the heat that can adversely affect the temperature characteristics of the laser diode 30c in an efficient manner.

Figure 11:
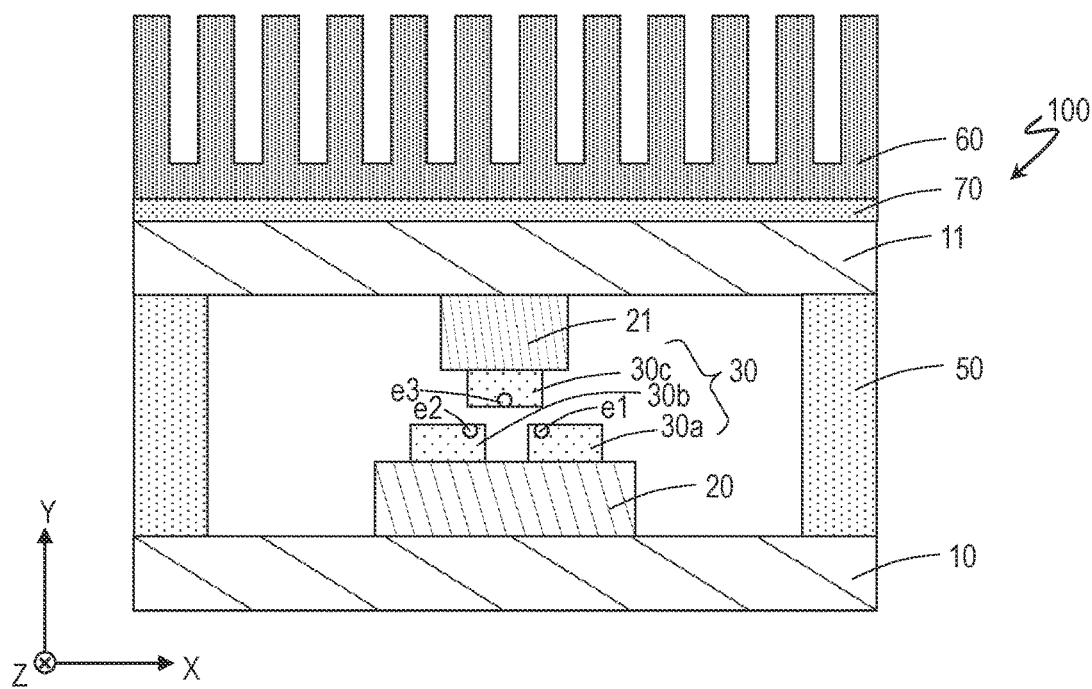
FIG. 11 is a cross-sectional view in the XY plane of yet another structure of the exemplary light source device according to the First Embodiment.

FIG. 11 is a cross-sectional view in the XY plane of yet another structure of the light source device 100 according to this embodiment. As shown in the drawing, the light source device 100 can further include a Peltier device 70 in addition to the heat dissipating device 60. The Peltier element 70 can be disposed between the substrate 11 and the heat dissipating device 60. Allowing a DC current to flow through the Peltier device 70 can efficiently cool the substrate 11, thereby further improving the heat dissipation performance of the light source device 100.

Second Embodiment

A light source device 101 according to a Second Embodiment will be explained next with reference to FIG. 12 to FIG. 14. The light source device 101 according to this embodiment differs from the light source device 100 according to the First Embodiment such that the laser diode 30c is disposed to oppose the laser diode 30a. Hereinafter, the explanation will focus on the differences while omitting the description of the structures and functions of the members that are in common with the light source device 100 of the First Embodiment.

Figure 12:
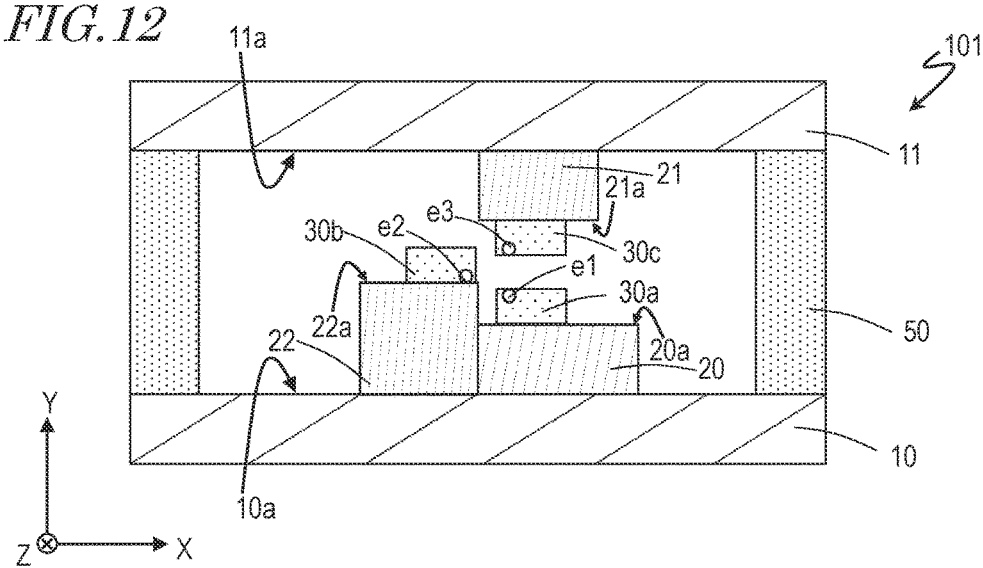
FIG. 12 is a cross-sectional view in the XY plane of an exemplary light source device according to a Second Embodiment.

FIG. 12 is a cross-sectional view in the XY plane of the light source device 101 according to this embodiment. The drawing shows a cross section that includes the emission end surfaces of the three laser diodes 30a, 30b, and 30c.

In this embodiment, the laser diode 30a emits green light. The laser diode 30a is face-up mounted on the mounting surface 20a of the submount 20 in the state of being fixed to the submount 20. The laser diode 30c emits blue light. The laser diode 30c is face-up mounted on the mounting surface 21a of the submount 21 in the state of being fixed to the submount 21. The laser diode 30c is disposed to oppose the laser diode 30a. For example, in a plan view, the laser diode 30c and the laser diode 30a can be disposed such that their emission points e1 and e3 overlap. The thickness of the submount 20 may be the same as or different from the thickness of the submount 21.

Face-up mounting the two laser diodes 30a and 30c on the two submounts 20 and 21, respectively, and adjusting the heights of the submounts can easily reduce the distance between the two emission points e1 and e3 in the direction perpendicular to the mounting surface 10a. The interval between the two emission points e1 and e3 can be adjusted, for example, to 0.01 mm to 0.2 mm.

The light source device 101 in this embodiment further includes a third submount 22 which is bonded to the mounting surface 10a and have the laser diode 30b mounted thereon. Hereinafter, similar to the first and second submounts, the third submount will simply be referred to as "submount." As shown in the drawing, the submount 22 can be disposed adjacently to the submount 20 on the mounting surface 10a. The submount 22 is thicker than the submount 20. The laser diode 30b in this embodiment emits red light. The laser diode 30b is mounted face down on the mounting surface 22a of the submount 22 in the state of being fixed to the submount 22.

When employing a red light emitting laser diode as the laser diode 30b as in this embodiment, face-down mounting the laser diode 30b on the mounting surface 22a of the submount 22 allows the heat generated by the laser diode 30b and the heat from the laser diodes 30a and 30c to be efficiently dissipated to the submount 22 while reducing the distance between the two emission points e1 and e3. Accordingly, change in the temperature characteristics of the laser diode 30b, which may be caused due to influence of heat, can be reduced.

In this embodiment, the distance in the height direction from the mounting surface 10a to the emission point e2 of the laser diode 30b is larger than the distance in the height direction from the mounting surface 10a to the emission point e1 of the laser diode 30a, and smaller than the distance in the height direction from the mounting surface 10a to the emission point e3 of the laser diode 30c. Alternatively, the distance in the height direction from the mounting surface 10a to the emission point e1 may be the same as the distance in the height direction from the mounting surface 10a to the emission point e2.

In the example shown in FIG. 12, the emission point e2 of the red light emitting laser diode 30b is located closer to the side which faces the laser diode 30a or 30c using the center of the laser diode 30b as a reference. Furthermore, the emission point e1 of the green light emitting laser diode 30a is located closer to the side which faces the laser diode 30b using the center of the laser diode 30a as a reference, and the emission point e3 of the blue light emitting laser diode 30c is located closer to the side that faces the laser diode 30b using the center of the laser diode 30c as a reference. Similar to the First Embodiment, the width of the gap between the laser diode 30b and the laser diode 30a or 30c is equal to or smaller than the width of the laser diode 30c. Such an arrangement can position the three emission points e1, e2, and 3e close together.

Disposing the laser diode 30c to oppose the laser diode 30a can position the emission point e3 of the laser diode 30c directly above the emission point e1 of the laser diode 30a, thereby further reducing the distance between the two emission points e1 and e3. Positioning the emission point e2 between the two emission points e1 and e3 in the height direction can further reduce the distance between the two emission points e1 and e2 as well as further reducing the distance between the two emission points e2 and e3. As a result, the three emission points e1, e2, and e3 can be arranged close together in a triangular shape. For example, the three emission points e1, e2, and e3 can be positioned in a circle whose diameter is the smallest width among the widths of the three laser diodes 30a, 30b, and 30c. The diameter of the circle can be, for example, 0.05 mm to 0.4 mm. The three emission points e1, e2, and e3 can be as close to one another as 0.15 mm or less.

Figure 13:
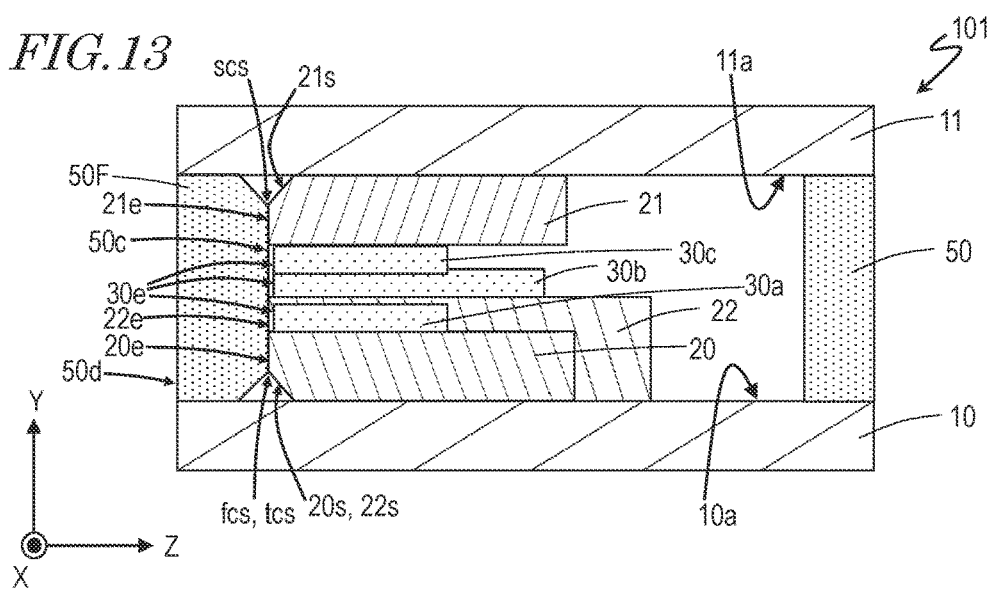
FIG. 13 is a cross-sectional view in the YZ plane of the exemplary light source device according to the Second Embodiment.

FIG. 13 is a cross-sectional view in the YZ plane of the light source device 101 according to this embodiment. Similar to the First Embodiment, one end surface of each of the submounts 20, 21, and 22 may be partly in contact with the incident surface 50c. To explain specifically, the submount 22 has an end surface 22e which includes an oblique surface 22s on the side where the incident surface 50c of the light transmitting part 50F is located. The portion of the end surface 20e excluding the oblique surface 20s is in contact with the incident surface 50c, and the portion of the end surface 21e excluding the oblique surface 21s is in contact with the incident surface 50c. Furthermore, the portion of the end surface 22e excluding the oblique surface 22s can be in contact with the incident surface 50c. This can provide the benefit of facilitating the Z direction positional adjustments of the emission points of the laser diodes 30 mounted on the submounts.

Due to limitations in size of mounting space, it may be difficult for all of the end faces to be partly in contact with the incident surface of the light transmitting part. In such a case, a portion of the end surface of at least one of the submounts is brought into contact with the incident surface of the light transmitting part. The other submounts are mounted with reference to the submount whose end surface is partly in contact with the incident surface, so that the positions of the emission points of the laser diodes can be adjusted in the Z direction.

The portion of the end surface 20e of the submount 20 in contact with the incident surface 50c forms a first contact surface fcs. The first contact surface fcs is spaced apart from the mounting surface 10a. The portion of the end surface 21e of the submount 21 in contact with the incident surface 50c forms a second contact surface scs. The second contact surface scs is spaced apart from the mounting surface 11a. Furthermore, the portion of the end surface 22e of the submount 22 in contact with incident surface 50c forms a third contact surface tcs. The third contact surface tcs is spaced apart from the mounting surface 10a. Spacing the first contact surface fcs, the second contact surface scs, and the third contact surface tcs apart from the mounting surfaces 10a and 11a can secure spaces for allowing excess bonding material to escape.

Figure 14:
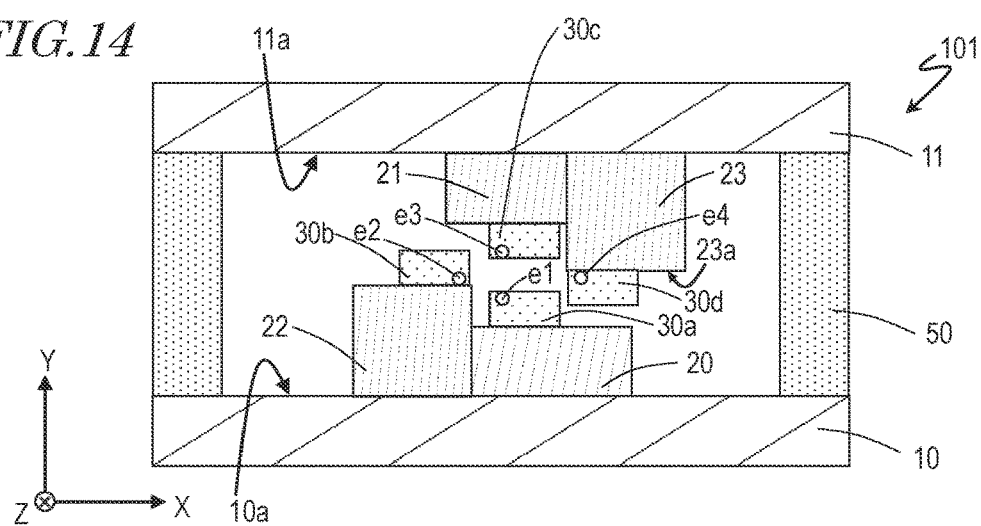
FIG. 14 is a cross-sectional view in the XY plane of another structure of the exemplary light source device according to the Second Embodiment.

FIG. 14 is a cross-sectional view in the XY plane of another structure of the light source device 101 according to this embodiment. The drawing shows a cross section that includes the emission end surfaces of the four laser diodes 30a, 30b, 30c, and 30d.

The light source device 101 can further include a fourth submount 23 and a fourth laser diode 30d. Hereinafter, the fourth submount, similar to the first to third submounts, will be simply referred to as "submount" and the fourth laser diode, similar to the first to third laser diodes, will be simply referred to as "laser diode." The laser diode 30d can be directly or indirectly supported by the mounting surface 11a. The laser diode 30d in this embodiment emits infrared light. This achieves a light source device which have four laser diodes 30 that emit three primary colors RGB and infrared light mounted in a package. The infrared light emitting laser diode 30d can be used, for example, as a distance measuring laser diode.

The submount 23 is bonded to the mounting surface 11a. The laser diode 30d is mounted face down on the mounting surface 23a of the submount 23 in the state of being fixed to the submount 23. As shown in FIG. 14, the submount 23 can be adjacently disposed to the submount 21 on the mounting surface 11a. The submount 23 is thicker than the submount 21. The thicknesses of the four submounts 20, 21, 22, and 23 can be different from one another.

The distance in the height direction from the mounting surface 10a to the emission point e4 of the laser diode 30d is equal to or larger than the distance in the height direction from the mounting surface 10a to the emission point e1 of the laser diode 30a, and smaller than the distance in the height direction from the mounting surface 10a to the emission point e3 of the laser diode 30c. The laser diode 30b and the laser diode 30d are preferably arranged such that the heights of the two emission points e2 and e4 from the mounting surface 10a are the same.

In the example shown in FIG. 14, the emission point e4 of the infrared light emitting laser diode 30d is located closer to the side which faces the laser diode 30a, 30b, or 30c using the center of the laser diode 30d as a reference. The emission point e4 of the laser diode 30d can be easily aligned by adjusting the thickness of the submount 23 to thereby position the four emission points e1, e2, e3, and e4 close together. The four emission points e1, e2, e3, and e4 can be positioned in a circle whose diameter is the smallest width among the widths of the four laser diodes 30a, 30b, 30c, and 30d. For example, the diameter of the circle can be 0.05 mm to 0.4 mm. The four emission points e1, e2, e3, and e4 can be as close to one another as 0.15 mm or less.

INDUSTRIAL APPLICABILITY

A light source device according to the present disclosure can be suitably utilized as a light source of a head-mounted display, projector, lighting fixture, or the like.

REFERENCE SIGNS LIST

10: first substrate, 10a: first mounting surface, 11: second substrate, 11a: second mounting surface, 14a, 14b, 14c: laser beam, 20: first submount, 21: second submount, 22: third submount, 23: fourth submount, 30a: first laser diode, 30b: second laser diode, 30c: third laser diode, 30d: fourth laser diode, 40a, 40b, 40c: protective element, 50: frame, 50F: light transmitting part, 60: heat dissipating device, 70: Peltier element, 100: light source device, 101: light source device, 200: collimating lens, e1, e2, e3: emission point, Pd: electrode pad, w: conductive wire

The invention claimed is:

1. A light source device comprising:
a first substrate having a first mounting surface;
a second substrate having a second mounting surface that opposes the first mounting surface;
a first laser diode directly or indirectly supported by the first mounting surface;
a second laser diode directly or indirectly supported by the first mounting surface;
a third laser diode directly or indirectly supported by the second mounting surface; and
a frame that defines a space for housing the first laser diode, the second laser diode, and the third laser diode, the frame being in contact with the first and second mounting surfaces, wherein
the emission point of the third laser diode is positioned between the emission point of the first laser diode and the emission point of the second laser diode in the width direction, and
in a plan view, when viewed in the direction perpendicular to the first mounting surface, at least one of the first laser diode or the second laser diode at least partially overlaps the third laser diode.

2. The light source device according to claim 1, wherein the width direction distance from the emission point of the first laser diode to the second laser diode is smaller than the width direction distance from the center of the first laser diode to the second laser diode, or the width direction distance from the emission point of the second laser diode to the first laser diode is smaller than the width direction distance from the center of the second laser diode to the first laser diode.

3. The light source device according to claim 1, wherein the width of the gap between the first laser diode and the second laser diode is equal to or smaller than the width of the third laser diode.

4. The light source device according to claim 3, wherein the third laser diode is disposed to oppose the first laser diode, and
the distance in the height direction from the first mounting surface to the emission point of the second laser diode is equal to or larger than the distance in the height direction from the first mounting surface to the emission point of the first laser diode, and smaller than the distance in the height direction from the first mounting surface to the third laser diode.

5. The light source device according to claim 4, wherein the first laser diode is directly or indirectly face-up mounted on the first mounting surface, and
the third laser diode is directly or indirectly face-up mounted on the second mounting surface.

6. The light source device according to claim 5, further comprising:
a first submount bonded to the first mounting surface and having the first laser diode disposed thereon, and
a second submount bonded to the second mounting surface and having the third laser diode disposed thereon, wherein
the first laser diode is face-up mounted on the mounting surface of the first submount, and
the third laser diode is face-up mounted on the mounting surface of the second submount.

7. The light source device according to claim 6 wherein the second laser diode is bonded to the mounting surface of the first submount.

8. The light source device according to claim 6, further comprising
a third submount bonded to the first mounting surface and having the second laser diode disposed thereon, wherein
the second laser diode is face-down mounted on the mounting surface of the third submount, and
the third submount is thicker than the first submount.

9. The light source device according to claim 1, wherein the first laser diode, the second laser diode, and the third laser diode emit laser light of different peak wavelengths from one another.

10. The light source device according to claim 8 wherein the second laser diode emits red light.

11. The light source device according to claim 10 wherein the first laser diode emits green light and the third laser diode emits blue light.

12. The light source device according to claim 1, wherein the optical axis of the outgoing laser light from the first laser diode, the optical axis of the outgoing laser light from the second laser diode, and the optical axis of the outgoing laser light from the third laser diode are positioned within a circle whose diameter is the smallest width among the widths of the first laser diode, the second laser diode, and the third laser diode.

13. The light source device according to claim 10, further comprising
a fourth laser diode directly or indirectly supported by the second mounting surface, wherein
the distance in the height direction from the first mounting surface to the emission point of the fourth laser diode is equal to or larger than the distance in the height direction from the first mounting surface to the emission point of the first laser diode, and smaller than the distance in the height direction from the first mounting surface to the emission point of the third laser diode.

14. The light source device according to claim 13 wherein the fourth laser diode emits infrared light.

15. The light source device according to claim 13, further comprising
a fourth submount bonded to the second mounting surface and having the fourth laser diode disposed thereon.

16. The light source device according to claim 6, wherein
the frame includes a light transmitting part through which the outgoing light from each laser diode passes,
the light transmitting part has an incident surface on which the outgoing laser light from each laser diode becomes incident, and an emission surface through which the outgoing laser light from each laser diode exits, and
one end surface of each of the first submount and the second submount is partially in contact with the incident surface.

17. The light source device according to claim 16, wherein
the portion of the end surface of the first submount in contact with the incident surface forms a first contact surface, the first contact surface being spaced apart from the first mounting surface, and
the portion of the end surface of the second submount in contact with the incident surface forms a second contact surface, the second contact surface being spaced apart from the second mounting surface.

18. The light source device according to claim 17, wherein
a first wiring layer is disposed between the first submount and the first substrate and between the frame and the first substrate, the groove created in the first wiring layer spacing the first contact surface apart from the first mounting surface, and
a second wiring layer is disposed between the second submount and the second substrate and between the frame and the second substrate, the groove created in the second wiring layer spacing the second contact surface apart from the second mounting surface.

19. The light source device according to claim 1, further comprising
a single lens for collimating the outgoing laser light from the first laser diode, the outgoing laser light from the second laser diode, and the outgoing laser light from the third laser diode.

20. The light source device according to claim 1, wherein the first laser diode, the second laser diode, and the third laser diode are hermetically sealed by the first substrate, the second substrate, and the frame.

* * * * *